(12) United States Patent
Gopalan

(10) Patent No.: US 6,869,853 B1
(45) Date of Patent: Mar. 22, 2005

(54) FABRICATION OF A BIPOLAR TRANSISTOR USING A SACRIFICIAL EMITTER

(75) Inventor: Prabhuram Gopalan, Fremont, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 2 days.

(21) Appl. No.: 10/323,002

(22) Filed: Dec. 18, 2002

(51) Int. Cl.[7] .................. H01L 29/737; H01L 21/8222
(52) U.S. Cl. ........................................ 438/321; 257/198
(58) Field of Search ........................... 438/321; 257/198

(56) References Cited

U.S. PATENT DOCUMENTS

| | | | |
|---|---|---|---|
| 4,871,684 A | 10/1989 | Glang et al. | |
| 4,960,726 A | 10/1990 | Lechaton et al. | |
| 5,128,271 A | 7/1992 | Bronner et al. | |
| 5,434,451 A | 7/1995 | Dalal et al. | |
| 5,998,847 A | 12/1999 | Assaderaghi et al. | |
| 6,255,694 B1 | 7/2001 | Mandelman et al. | |
| 6,329,698 B1 * | 12/2001 | Koscielniak et al. | ........ 257/565 |
| 6,414,371 B1 | 7/2002 | Freeman et al. | |
| 6,440,788 B2 | 8/2002 | Mandelman et al. | |
| 6,441,462 B1 | 8/2002 | Lanzerotti et al. | |
| 6,475,848 B1 | 11/2002 | Darwish et al. | |
| 6,683,366 B1 * | 1/2004 | Schuegraf | ................. 257/565 |

OTHER PUBLICATIONS

Clifford A. King, "SiGe Bipolar Transistors for High Speed Optical Networking and Wireless Communication Applications", Jul. 25, 2000, Bell Labs, Lucent Technologies, Murray Hill, NJ.

David Harame, "SiGe BiCMOS Technology New Possibilities of Integration", Aug. 2000, IBM Research and Development Center, Essex Junction, VT.

* cited by examiner

Primary Examiner—Jerome Jackson
(74) Attorney, Agent, or Firm—Okamoto & Benedicto LLP

(57) ABSTRACT

In one embodiment, a transistor is fabricated by forming a sacrificial emitter over a base, forming an oxide layer over the sacrificial emitter, removing a portion of the oxide layer, and then removing the sacrificial emitter. An emitter is later formed in the space formerly occupied by the sacrificial emitter. The sacrificial emitter allows a base implant step to be performed early in the process using a single masking step. The base may comprise epitaxial silicon-germanium or silicon.

17 Claims, 10 Drawing Sheets

US 6,869,853 B1

FABRICATION OF A BIPOLAR TRANSISTOR USING A SACRIFICIAL EMITTER

BACKGROUND OF THE INVENTION

1. Field of the Invention

The present invention relates generally to integrated circuits, and more articularly but not exclusively to bipolar transistors.

2. Description of the Background Art

As is well known, a bipolar transistor comprises a base, an emitter, and a collector. In a so-called "SiGe bipolar transistor", the base comprises silicon-germanium. SiGe bipolar transistors are popular because of their relatively high maximum frequency of oscillation ($F_{max}$) and switching frequency (Ft), which make them specially suitable for high-frequency applications such as wireless communications.

FIGS. 1(a) to 1(f) show cross-sectional views schematically illustrating a conventional method of forming an SiGe transistor. In FIG. 1(a), an SiGe layer 103 is epitaxially grown on a silicon layer 101. The epitaxial growth of SiGe layer 103 also results in the growth of polycrystalline silicon-germanium ("poly-SiGe") layers 104 on isolation structures 102. Isolation structures 102 may be shallow trench isolation (STI) structures filled with silicon dioxide.

In FIG. 1(b), a polycrystalline silicon ("polysilicon") layer 106 is formed over a silicon dioxide layer 105, which is formed over SiGe layer 103 and poly-SiGe layers 104. A mask comprising photoresists 108 is formed over polysilicon layer 106 to define an emitter window 121 (see FIG. 1(c)).

In FIG. 1(c), emitter window 121 is formed by etching through exposed portions of polysilicon layer 106, and through silicon dioxide layer 105. Emitter window 121 exposes a portion of SiGe layer 103 referred to as an "intrinsic base region". The rest of SiGe layer 103 and poly-SiGe layers 104 are referred to as "extrinsic base regions". The intrinsic base region serves as the base of the transistor being fabricated.

In FIG. 1(d), a polysilicon layer 107 is deposited over the sample of FIG. 1(c).

In FIG. 1(e), another mask, which comprises a photoresist 109, is patterned on polysilicon layer 107 to define an emitter.

In FIG. 1(f), polysilicon layer 107 is etched to form the emitter. Extrinsic base implant and activation steps are then performed.

The above described method uses one mask (i.e., photoresists 108) to define the emitter window and another mask (i.e., photoresist 109) to define the emitter. A misalignment in any of the two masks may lead to variations in the distance between the emitter and the extrinsic base regions. These distance variations may result in increased capacitance, high base leakage current, and/or high resistance in the base. Additionally, the use of two masks may result in un-implanted regions between the emitter and the extrinsic base regions. These un-implanted regions are high resistance regions that may reduce the $F_{max}$ of the device.

SUMMARY

In one embodiment, a transistor is fabricated by forming a sacrificial emitter over a base, forming an oxide layer over the sacrificial emitter, removing a portion of the oxide layer, and then removing the sacrificial emitter. An emitter is later formed in the space formerly occupied by the sacrificial emitter. The sacrificial emitter allows a base implant step to be performed early in the process using a single masking step. The base may comprise epitaxial silicon-germanium or silicon.

These and other features of the present invention will be readily apparent to persons of ordinary skill in the art upon reading the entirety of this disclosure, which includes the accompanying drawings and claims.

The use of the same reference label in different drawings indicates the same or like components. Drawings are not necessarily to scale unless otherwise noted.

DETAILED DESCRIPTION

In the present disclosure, numerous specific details are provided such as examples of materials, process steps, and structures to provide a thorough understanding of embodiments of the invention. Persons of ordinary skill in the art will recognize, however, that the invention can be practiced without one or more of the specific details. In other instances, wellknown details are not shown or described to avoid obscuring aspects of the invention. For example, masking and implant activation steps not necessary to the understanding of the invention have been omitted in the interest of clarity.

Figure 1A:
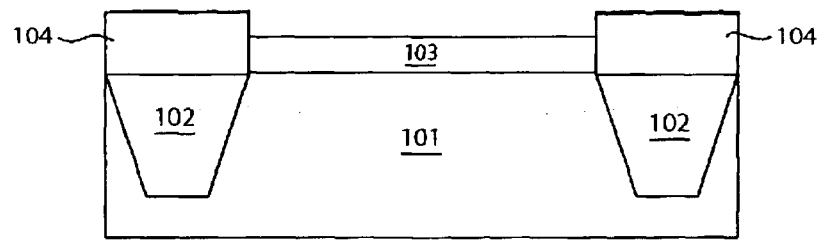
FIGS. 1(a) to 1(f) show cross-sectional views schematically illustrating a conventional method of forming an SiGe transistor.
Figure 1B:
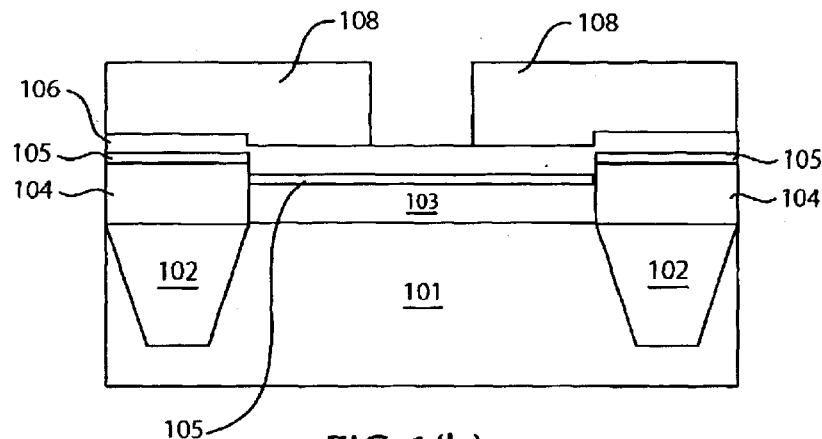
Figure 1C:
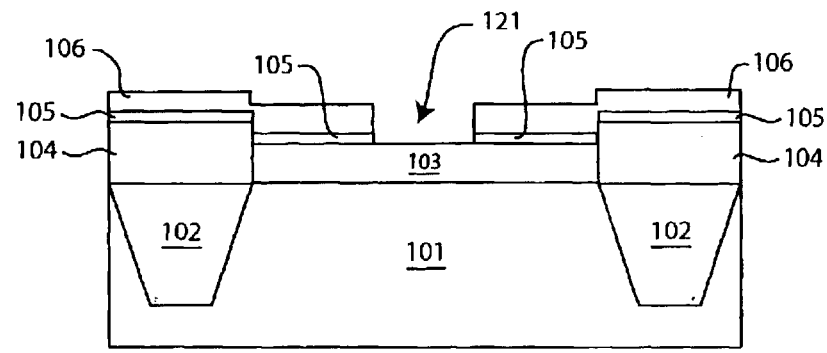
Figure 1D:
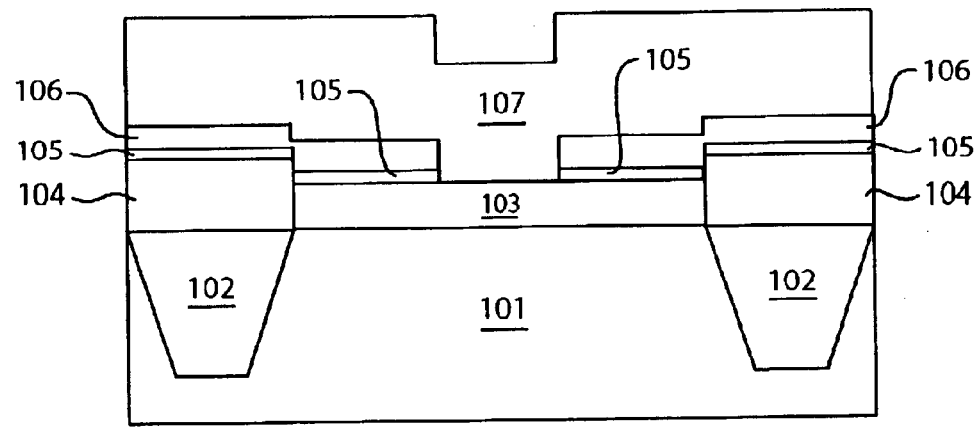
Figure 1E:
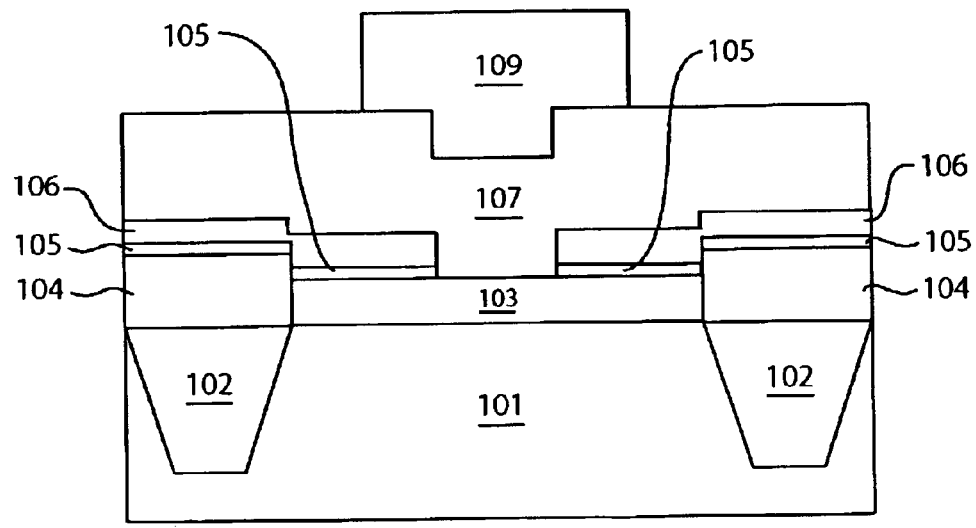
Figure 1F:
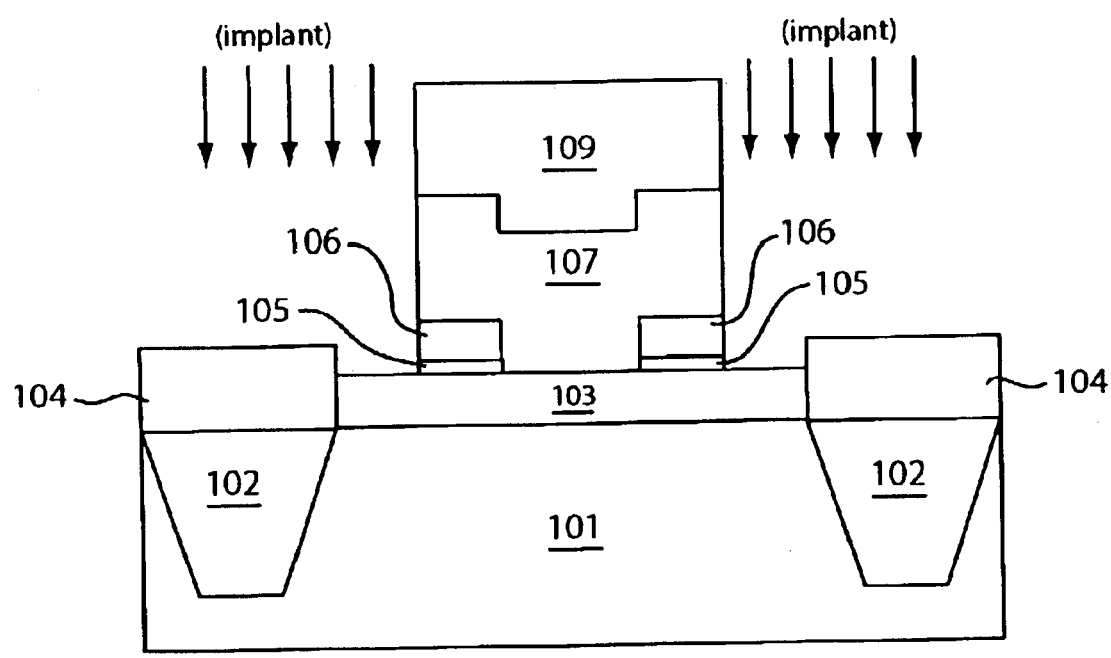
Figure 2A:
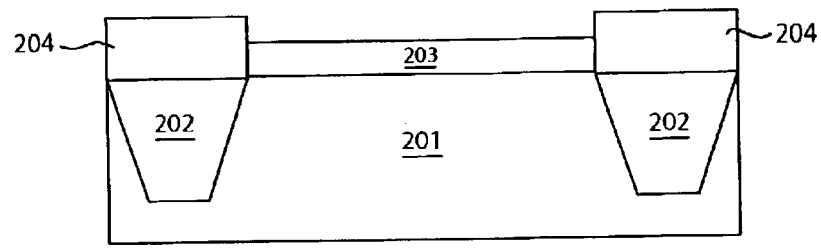
FIGS. 2(a) to 2(m) show cross-sectional views schematically illustrating a method of fabricating an SiGe transistor in accordance with an embodiment of the present invention.

FIGS. 2(a) to 2(m) show cross-sectional views schematically illustrating a method of fabricating an SiGe transistor in accordance with an embodiment of the present invention. In FIG. 2(a), isolation structures 202 are formed in an amorphous silicon layer 201. Isolation structures 202 may be shallow trench isolation (STI) structures filled with silicon dioxide, for example. Polycrystalline silicon-germanium ("poly-SiGe") layers 204 and a silicon-germanium (SiGE) layer 203 are formed on isolation structures 202 and silicon layer 201, respectively. Poly-SiGe layers 204 and epitaxial SiGe layer 203 may be formed by epitaxial growth.

The portion of SiGe layer 203 that will be under a subsequently formed emitter is referred to as an "intrinsic base region", while the rest of SiGe layer 203 and poly-SiGe layers 204 are referred to as "extrinsic base regions". The intrinsic base region serves as the base of the transistor being fabricated. Note that although embodiments of the present invention are described using a base comprising SiGe as an example, the present invention may also be employed in the fabrication of transistors having a base comprising silicon. That is, layer 203 may be a silicon layer instead of an SiGe layer.

Figure 2B:
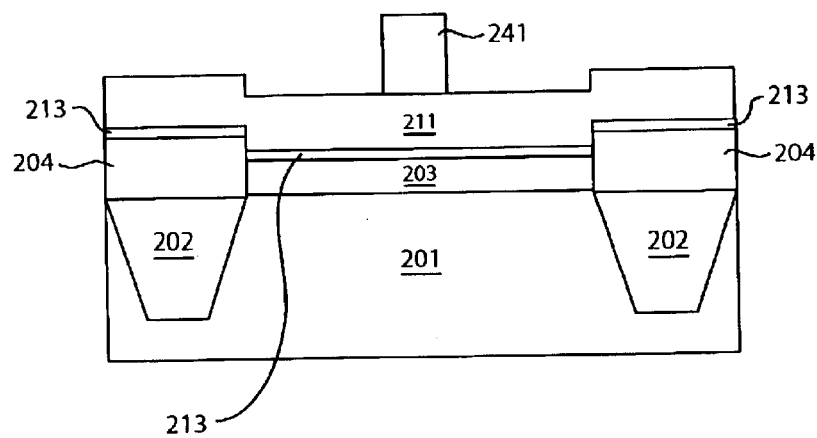

In FIG. 2(b), an oxide layer 213 is formed over the sample of FIG. 2(a). Oxide layer 213 may comprise silicon dioxide deposited using TEOS as a precursor. In one embodiment, oxide layer 213 is deposited to a thickness of about 300

Angstroms by plasma enhanced chemical vapor deposition (PECVD). Thereafter, a polycrystalline silicon ("polysilicon") layer 211 is formed over oxide layer 213. Polysilicon layer 211 may be deposited to a thickness of about 2500 Angstroms by low-pressure chemical vapor deposition (LPCVD), for example. Polysilicon layer 211 serves as a sacrificial emitter material, and therefore does not need implantation and activation steps.

It is to be noted that as used in the present disclosure, the terms "over", "overlying", "under" and "underlying" refer to the relative placement of two materials that may or may not be directly in contact with each other. That is, the two materials may be separated by another material. For example, another material may be placed between polysilicon layer 211 and oxide layer 213.

Also shown in FIG. 2(b) is a mask (sacrificial emitter mask) comprising photoresist 241. Photoresist 241 defines the sacrificial emitter 211' (see FIG. 2(c)).

Figure 2C:
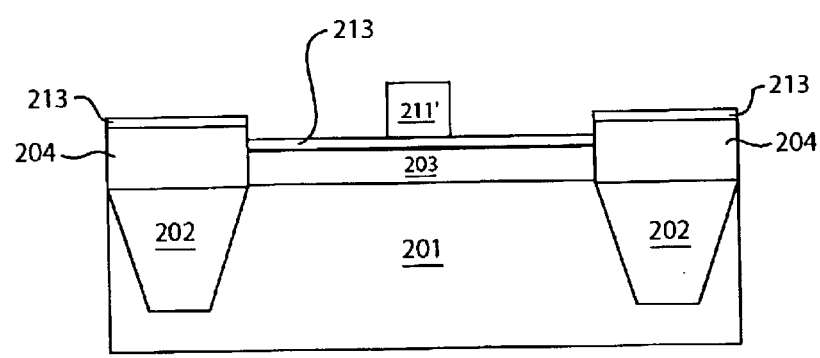

In FIG. 2(c), polysilicon layer 211 is etched to form sacrificial emitter 211'. Sacrificial emitter 211' may be formed by dry etching polysilicon layer 211. Sacrificial emitter 211' may have a width of about 0.13 microns to about 0.5 microns depending on the application. As will be more apparent below, sacrificial emitter 211' is used to self-align a base implantation step. Sacrificial emitter 211' is removed at a later step to make room for an emitter.

Figure 2D:
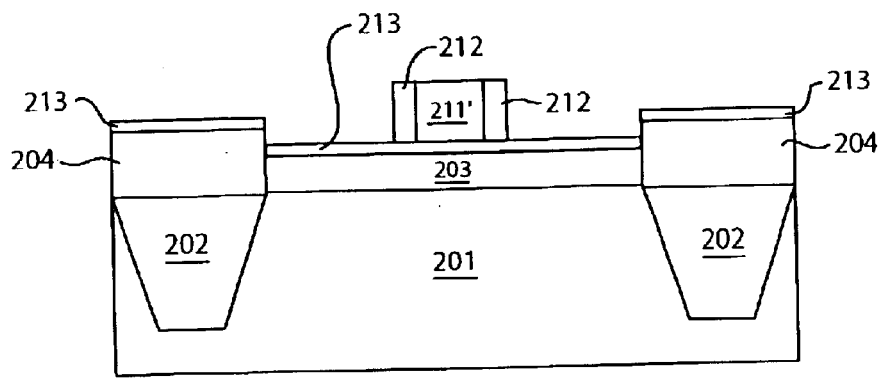

In FIG. 2(d), spacers 212 are formed on the sidewalls of sacrificial emitter 211'.

In one embodiment, spacers 212 are formed by depositing a silicon nitride layer over the sample of FIG. 2(c), and then blanket etching the silicon nitride layer. Blanket etching allows spacers 212 to be formed with relatively good accuracy, which in turn allows for additional margin of error in forming sacrificial emitter 211'. Spacers 212 may be formed to a width of about 700 Angstroms, for example.

Preferably, spacers 212 are "boxy" in that they have substantially vertical sidewalls. One way of forming boxy spacers 212 is to etch a silicon nitride spacer material in a two step dry etch process having: (a) a first step employing an etch chemistry comprising $C_2F_6$, Ar, and $O_2$, and (b) a second step employing an etch chemistry comprising $CF_4$ and $O_2$. The first step is also referred to as a "main etch", and may be terminated using an end-point detector. The second step may be a timed etch.

Figure 2E:
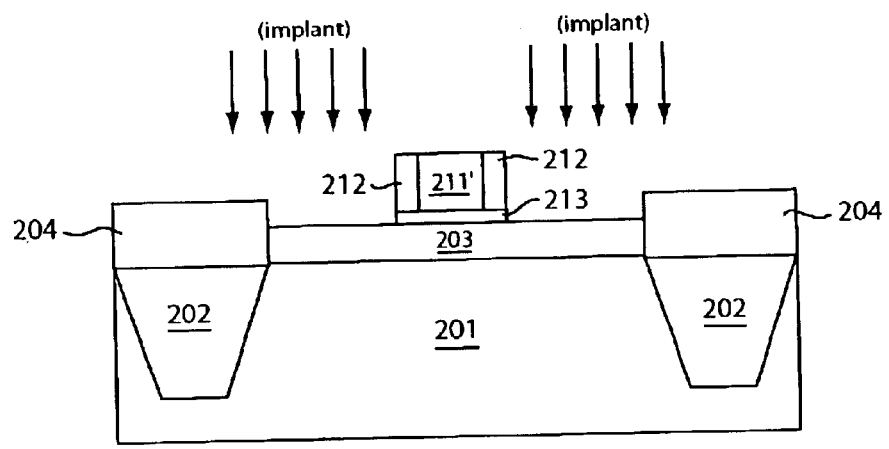

In FIG. 2(e), portions of oxide layer 213 not under sacrificial emitter 211' are removed using a wet-etch process. Thereafter, an extrinsic base implant step is performed. In one embodiment, the dopant implanted in the extrinsic base regions is a P-type dopant, such as Boron or $BF_2$, to form an NPN SiGe transistor. The dopant is then activated in a later step not shown.

As can be appreciated from the foregoing, the base implant step is self-aligned with respect to spacers 212, which is formed with respect to sacrificial emitter 211'. Because sacrificial emitter 211' is formed using a single mask (i.e., photoresist 241), problems associated with variations in the distance between the extrinsic base regions and a subsequently formed emitter (see emitter 231' shown in FIG. 2(m)) are alleviated.

Figure 2F:
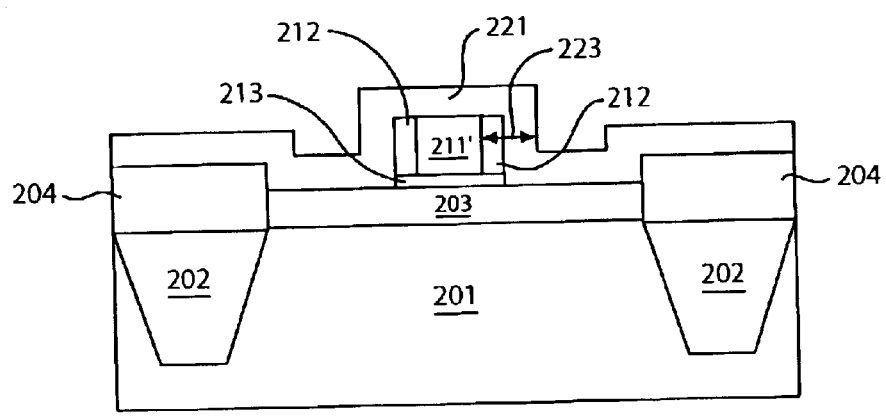

In FIG. 2(f), an oxide layer 221 is formed over the sample of FIG. 2(e). As will be more apparent below, oxide layer 221 advantageously facilitates removal of sacrificial emitter 211' by covering materials that need to be protected during etching steps. Oxide layer 221 may comprise silicon dioxide deposited using TEOS as a precursor. Oxide layer 221 may be deposited to a thickness of about 1000 Angstroms by low-temperature low-pressure chemical vapor deposition (LPCVD). Preferably, oxide layer 221 is conformally deposited (i.e., with substantially uniform thickness throughout) to have enough material for subsequent etching steps. For example, oxide layer 221 and a spacer 212 preferably has a total width 223 that is greater than 2 lynches. As is well known, a "lynch" is a minimum error margin for two layers of materials that are to be aligned. The value of a lynch depends on application specific factors, such as critical dimensions and the stepper used for alignment.

Figure 2G:
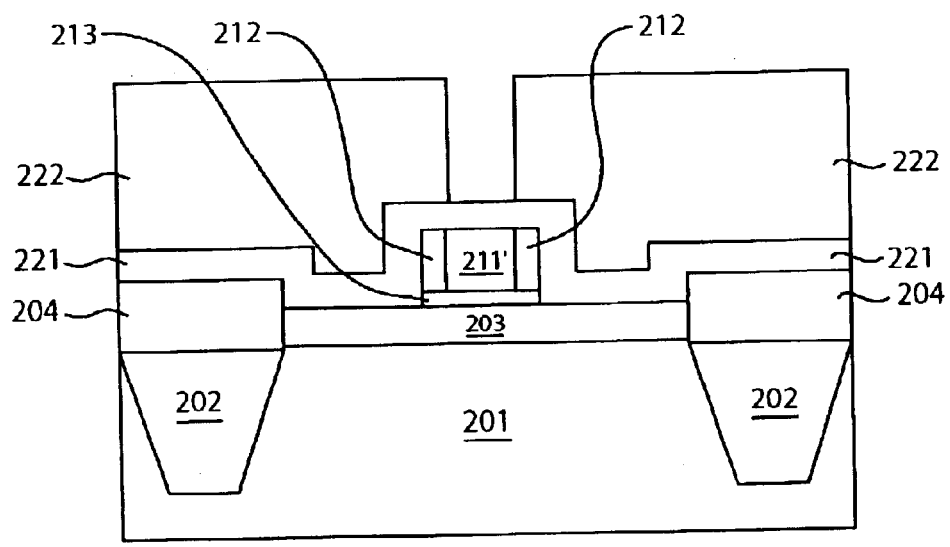

In FIG. 2(g), a mask comprising photoresists 222 is formed over the sample of FIG. 2(f) such that a portion of oxide layer 221 over sacrificial emitter 211' is exposed. In one embodiment, photoresists 222 are formed by spin coating a photoresist material over the sample of FIG. 2(f), and then performing alignment, exposure, and development steps such that a hole through the photoresist material is in-line with sacrificial emitter 211'. Photoresists 222 may be formed to a thickness of about 5000 Angstroms to about 1.5 microns, depending on the application. Photoresists 222 may have an underlying anti-reflective coating. In that case, the anti-reflective coating may have to be etched to expose oxide layer 221. Preferably, a developable anti-reflective coating is employed so that it can be developed at the same time as photoresists 222, thus obviating the need to remove the anti-reflective coating in a separate etching step.

Figure 2H:
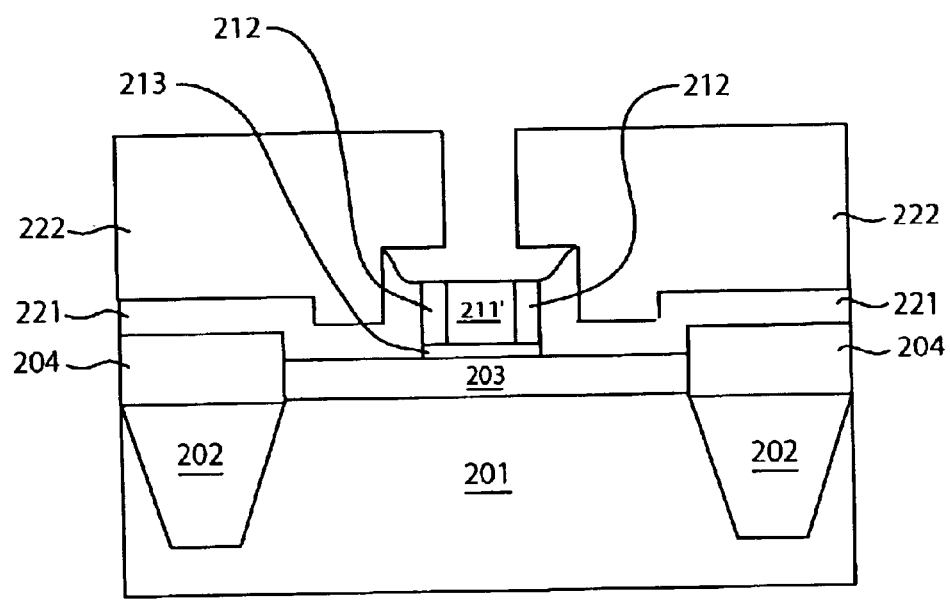

In FIG. 2(h), a portion of oxide layer 221 is removed to expose sacrificial emitter 211'. In one embodiment, the portion of oxide layer 221 is removed using a wet etch process, such as a BOE (buffered oxide etch) process. A wet etch process is isotropic and thus results in an undercut under photoresists 222. The undercut helps in completely exposing the top portion of sacrificial emitter 211'. This, in turn, advantageously facilitates removal of sacrificial emitter 211' in a subsequent etching step.

Figure 2I:
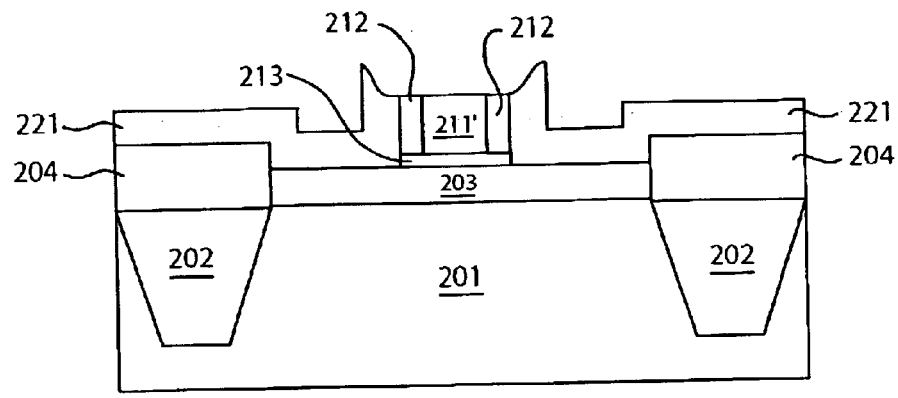

In FIG. 2(i), photoresists 222 are removed from the sample of FIG. 2(h). Note that depending on the application, photoresists 222 may also be removed in a later step.

Figure 2J:
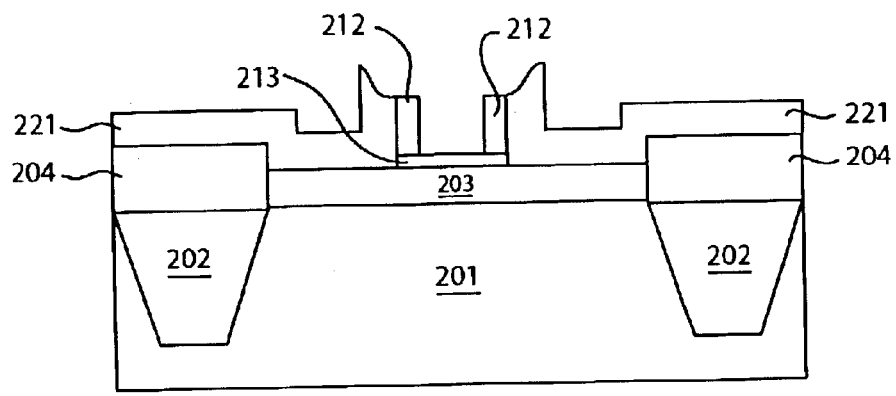

In FIG. 2(j), sacrificial emitter 211' is removed. In one embodiment, sacrificial emitter 211' is removed using a poly-etch process that is selective to spacers 212 of silicon nitride and oxide layers 221 and 213. For example, sacrificial emitter 211' may be dry etched using an etch chemistry comprising HBr, $Cl_2$, and He. Sacrificial emitter 211' may be etched using oxide layer 213 as an etch stop.

Figure 2K:
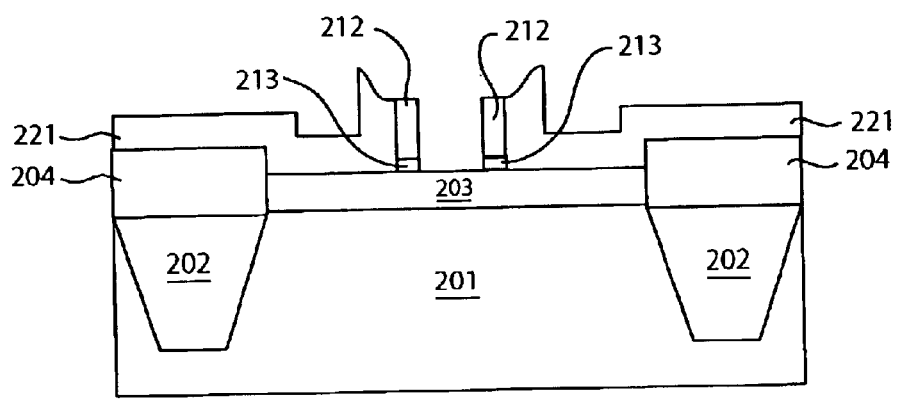

In FIG. 2(k), a portion of oxide layer 213 is removed to expose SiGe layer 203. In one embodiment, the portion of oxide layer 213 is removed using a wet etch process referred to as a "pre-clean". Etching of oxide layer 213 allows an emitter (e.g., emitter 231' shown in FIG. 2(m)) to make contact with the intrinsic base comprising SiGe layer 203.

Figure 2L:
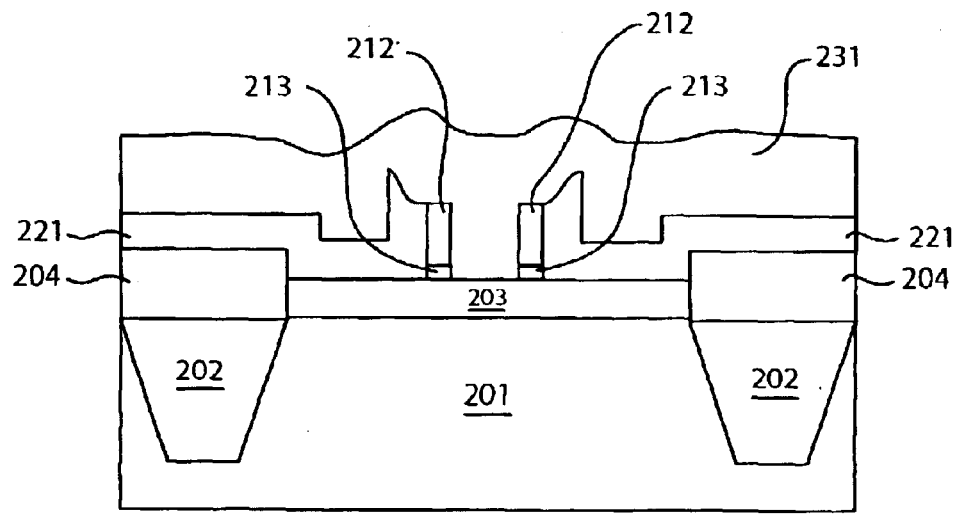

In FIG. 2(l), an emitter material comprising a polysilicon layer 231 is formed over the sample of FIG. 2(k). Polysilicon layer 231 may be formed to a thickness of about 1500 Angstroms to about 2500 Angstroms by LPCVD. A dopant is then implanted and later activated in polysilicon layer 231. In one embodiment, an N-type dopant, such as Arsenic, is implanted and activated in polysilicon layer 231 to form an NPN SiGe transistor. Depending on the application, the emitter material may also be an in-situ doped non-selective epitaxial layer or polysilicon layer, or an in-situ doped selective epitaxial layer.

Figure 2M:
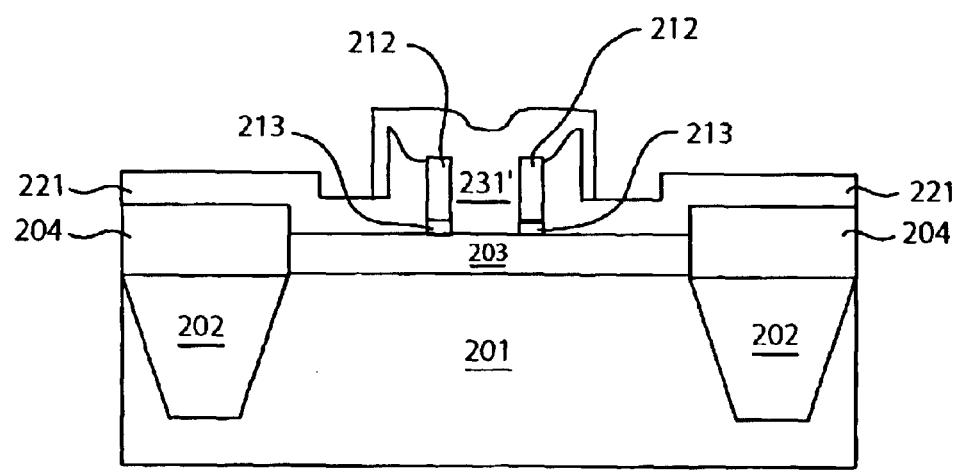

In FIG. 2(m), polysilicon layer 231 is etched to form an emitter 231'.

As can be appreciated from the foregoing, sacrificial emitter 211' advantageously allows a self-aligned base implant step to be performed relatively early in the fabrication process. After the base implant step, sacrificial emitter 211' is removed to allow an emitter to be formed in its place. The just described method of fabricating an SiGe transistor illustrates one way of removing sacrificial emitter 211'. Another way of removing sacrificial emitter 211' is now described with reference to FIGS. 3(a)–3(e).

Figure 3A:
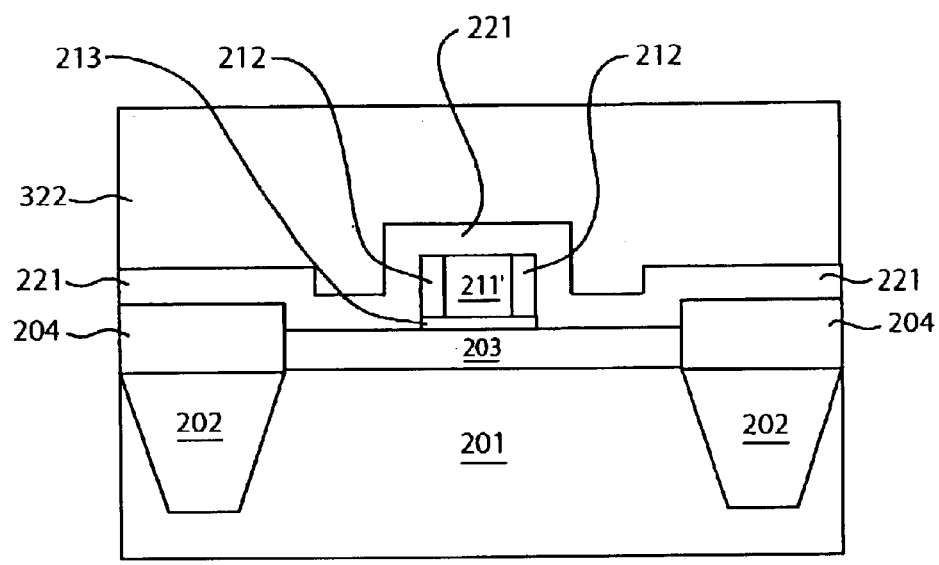
FIGS. 3(a)–3(e) show cross-sectional views schematically illustrating a method of fabricating an SiGe transistor in accordance with another embodiment of the present invention.

FIGS. 3(a)–3(e) show cross-sectional views schematically illustrating a method of fabricating an SiGe transistor in accordance with another embodiment of the present invention. In FIG. 3(a), a mask comprising photoresist 322 is formed over the sample of FIG. 2(f). That is, photoresist 322 is formed after the process steps illustrated with reference to FIGS. 2(a)–2(f) are completed. In one embodiment, photoresist 322 is formed to a thickness of about 7000 Angstroms by spin coating.

Figure 3B:
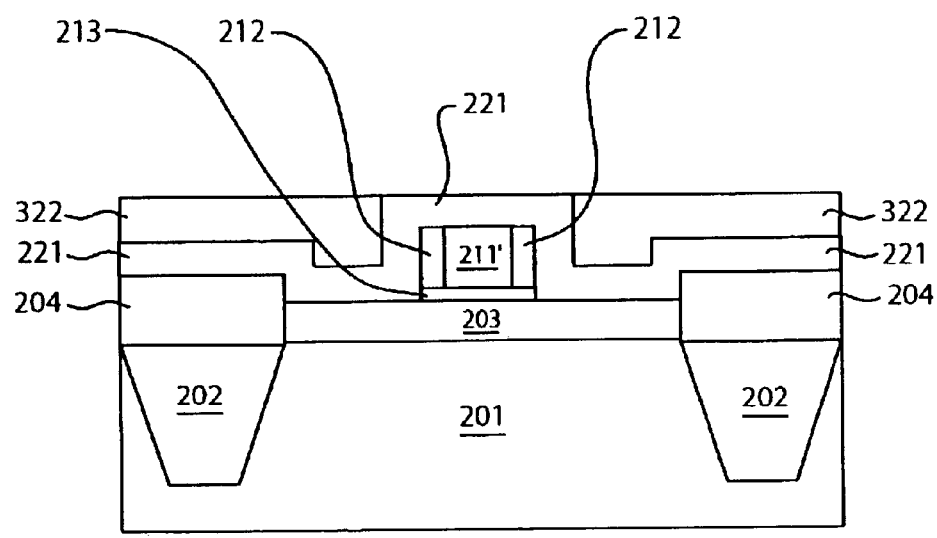

In FIG. 3(b), photoresist 322 is planarized to expose a portion of oxide layer 221 over sacrificial emitter 211'. In one embodiment, photoresist 322 is planarized using an etch-back process that is selective to oxide layer 221. For example, an etch chemistry comprising $Cl_2$ may be used to achieve a selectivity of approximately 10:1 to 15:1 with respect to oxide layer 221. Portions of photoresist 322 that were not etched serve as a mask for subsequent etching steps. For any given application, the thickness of photoresist 322 may be increased to improve the etch-back error margin.

Figure 3C:
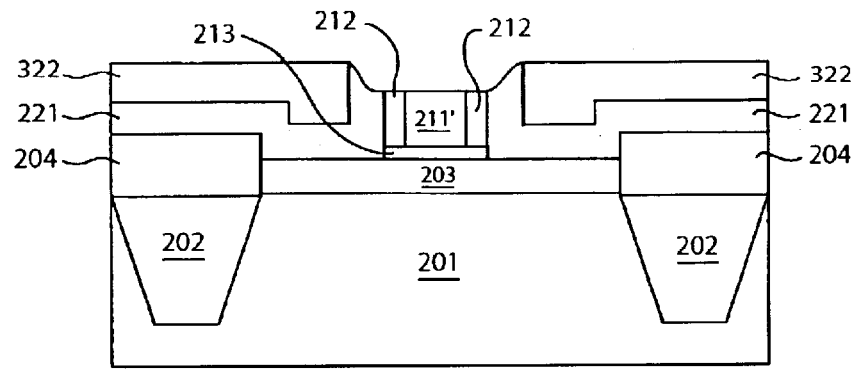

In FIG. 3(c), a portion of oxide layer 221 is removed to expose sacrificial emitter 211'. In one embodiment, the portion of oxide layer 211 is removed by performing a wet etch process, such as a BOE process, on the sample of FIG. 3(b). The wet etch process isotropically etches oxide layer 211 to advantageously expose most of the top portion of sacrificial emitter 211'.

Figure 3D:
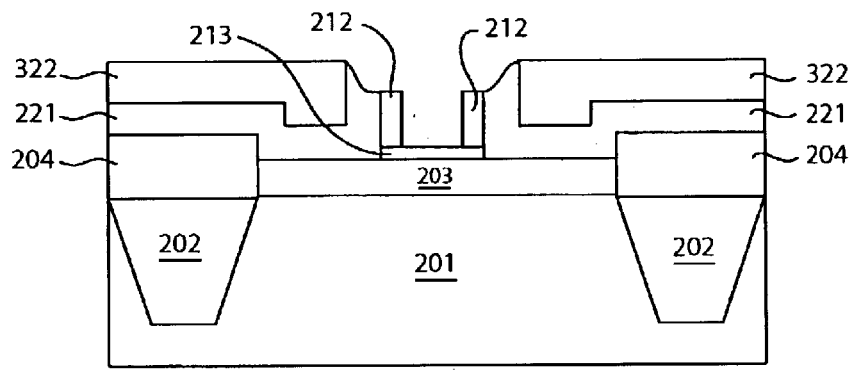

In FIG. 3(d), sacrificial emitter 211' is removed. In one embodiment, sacrificial emitter 211' is removed using a poly-etch process that is selective to spacers 212 of silicon nitride and oxide layers 221 and 213. For example, sacrificial emitter 211' may be dry etched using an etch chemistry comprising HBr, $Cl_2$, and He. Sacrificial emitter 211' may also be wet etched using an etch chemistry comprising $XeF_2$ or HNO3:HF mixture. Sacrificial emitter 211' may be etched using oxide layer 213 as an etch stop.

Figure 3E:
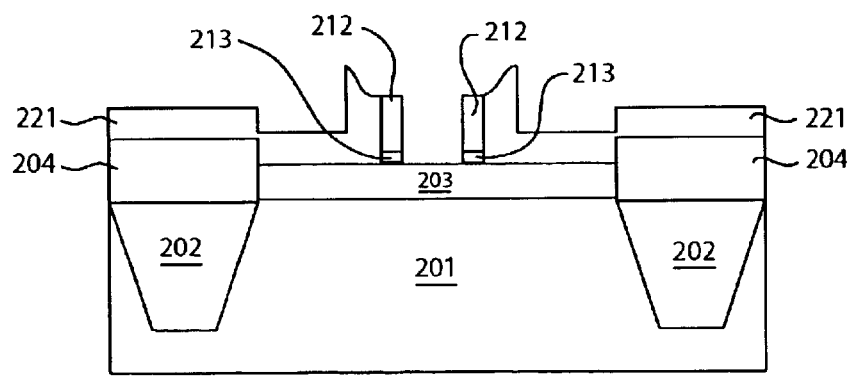

In FIG. 3(e), a portion of oxide layer 213 is removed to expose SiGe layer 203. In one embodiment, the portion of oxide layer 213 is removed using a wet etch process referred to as a "pre-clean". Etching of oxide layer 213 allows an emitter (e.g., emitter 231' shown in FIG. 2(m)) to make contact with the intrinsic base comprising SiGe layer 203. Also in FIG. 3(e), remaining portions of photoresist 322 are removed. Depending on the application, photoresist 322 may also be removed at anytime after the etching of oxide layer 221.

Thereafter, an emitter may be formed in place of sacrificial emitter 211' as in FIGS. 2(l) and 2(m).

While specific embodiments of the present invention have been provided, it is to be understood that these embodiments are for illustration purposes and not limiting. Many additional embodiments will be apparent to persons of ordinary skill in the art reading this disclosure. For example, although the above embodiments illustrate the fabrication of an NPN SiGe transistor, embodiments of the invention may also be adapted to fabricate PNP SiGe transistors. Thus, the invention is limited only by the following claims.

What is claimed is:

1. A method of fabricating a bipolar transistor, the method comprising:

forming a sacrificial emitter over a base;

forming a first oxide layer over the sacrificial emitter;

forming a masking material over the first oxide layer;

planarizing the masking material to expose the first oxide layer;

etching a portion of the first oxide layer over the sacrificial emitter; and removing the sacrificial emitter.

2. The method of claim 1 wherein the base comprises silicon-germanium (SiGe).

3. The method of claim 1 wherein the sacrificial emitter comprises:

a polysilicon material over a second oxide layer.

4. The method of claim 1 further comprising:

after forming the sacrificial emitter but prior to forming the first oxide layer, implanting a dopant in an extrinsic base region.

5. The method of claim 1 wherein the base comprises silicon.

6. The method of claim 1 wherein removing the sacrificial emitter comprises:

etching the sacrificial emitter using a second oxide layer as an etch stop; and etching the second oxide layer to expose the base.

7. The method of claim 1 further comprising:

forming a polysilicon material on the base.

8. The method of claim 1 wherein forming the masking material over the first oxide layer comprises spin-coating a photoresist material.

9. The method of claim 1 wherein planarizing the masking material comprises performing an etch-back process.

10. A method of forming a bipolar transistor, the method comprising:

implanting a dopant in a silicon-germanium (SiGe) layer that is under a sacrificial emitter;

depositing a first oxide layer over the sacrificial emitter;

forming a mask over the first oxide layer:

isotropically etching the first oxide layer to create an undercut under the mask and fully expose a top portion of the sacrificial emitter; and replacing the sacrificial emitter with an emitter.

11. The method of claim 10 wherein replacing the sacrifical emitter with an emitter comprises:

etching the sacrificial emitter to expose a second oxide layer;

etching the second oxide layer to expose the SiGe layer; and forming the emitter in a volume previously occupied by the sacrificial emitter.

12. The method of claim 1 wherein the masking material comprises photoresist.

13. A method of fabricating a bipolar transistor, the method comprising:

forming a sacrificial emitter over a base;

forming a first oxide layer over the sacrificial emitter;

forming a masking material over the sacrificial emitter such that a portion of the first oxide layer is exposed;

isotropically etching the first oxide layer to create an undercut under the masking material and fully expose a top portion of the sacrificial emitter; and removing the sacrificial emitter.

14. The method of claim 13 wherein isotropically etching the first oxide layer comprises wet etching the first oxide layer.

15. The method of claim 13 wherein the base comprises silicon-germanium (SiGe).

16. The method of claim 13 wherein the sacrificial emitter comprises:

a polysilicon material over a second oxide layer.

17. The method of claim 13 further comprising:

after forming the sacrificial emitter but prior to forming the first oxide layer, implanting a dopant in an extrinsic base region.

* * * * *